United States Patent
De Lorenzo et al.

(10) Patent No.: US 7,269,481 B2
(45) Date of Patent: Sep. 11, 2007

(54) METHOD AND APPARATUS FOR MEMORY BANDWIDTH THERMAL BUDGETTING

(75) Inventors: David S. De Lorenzo, Olympia, WA (US); Stephen W. Montgomery, Federal Way, WA (US); Warren R. Morrow, Steilacoom, WA (US); Robin Steinbrecher, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 434 days.

(21) Appl. No.: 10/606,514

(22) Filed: Jun. 25, 2003

(65) Prior Publication Data

US 2004/0267409 A1   Dec. 30, 2004

(51) Int. Cl.
G05D 23/00  (2006.01)
G05B 11/01  (2006.01)
G05B 13/02  (2006.01)
G06F 12/00  (2006.01)
G06F 15/00  (2006.01)

(52) U.S. Cl. ............ 700/299; 700/21; 700/29; 700/31; 700/46; 700/52; 700/306; 711/154; 702/132; 713/300

(58) Field of Classification Search ............ 700/21, 700/29, 31, 32, 46, 52, 89, 299, 300, 306; 711/154; 702/130, 132; 713/300
See application file for complete search history.

(56) References Cited

U.S. PATENT DOCUMENTS

| 5,422,806 | A  | * | 6/1995  | Chen et al. ............ 700/29 |
| 5,557,551 | A  | * | 9/1996  | Craft ................... 702/130 |
| 6,047,248 | A  | * | 4/2000  | Georgiou et al. ....... 702/132 |
| 6,115,441 | A  | * | 9/2000  | Douglass et al. ........ 377/25 |
| 6,173,217 | B1 | * | 1/2001  | Bogin et al. ........... 700/299 |
| 6,470,238 | B1 | * | 10/2002 | Nizar et al. ........... 700/299 |
| 2002/0143488 | A1 |   | 10/2002 | Cooper et al. |
| 2003/0060934 | A1 | * | 3/2003  | Walsh ................. 700/299 |
| 2004/0215371 | A1 |   | 10/2004 | Samson et al. |

FOREIGN PATENT DOCUMENTS

WO   WO 00/11675   3/2000

* cited by examiner

*Primary Examiner*—Leo Picard
*Assistant Examiner*—Sean Shechtman
(74) *Attorney, Agent, or Firm*—Alan Pedersen-Giles

(57) ABSTRACT

An electronic system includes a device and a controller to the device. The controller is adapted to calculate a temperature estimate of the device and to control access to the device in accordance with the calculated temperature estimate.

24 Claims, 5 Drawing Sheets

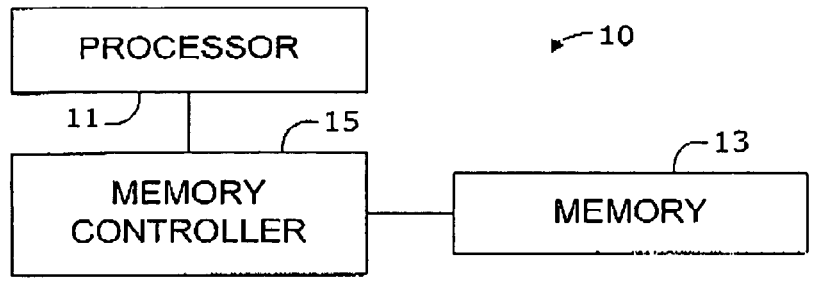
Prior Art    Fig. 1
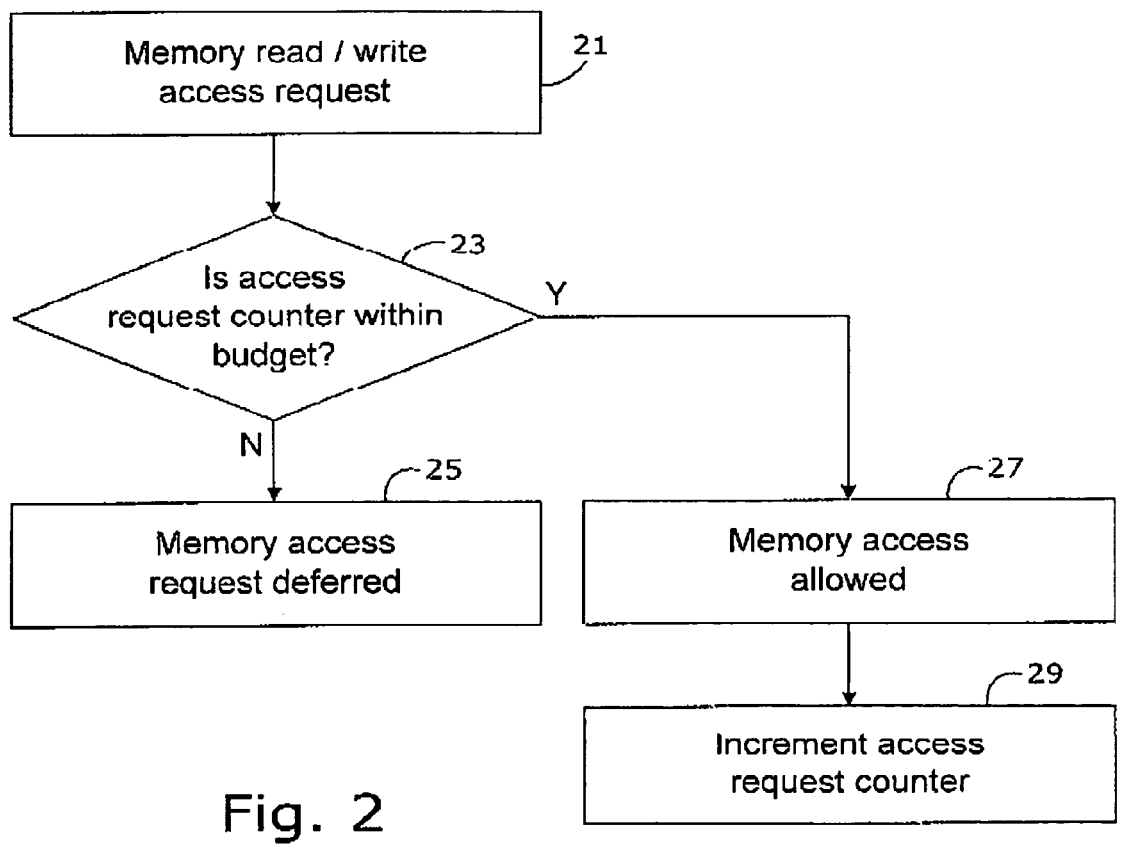
Fig. 2

METHOD AND APPARATUS FOR MEMORY BANDWIDTH THERMAL BUDGETTING

FIELD OF THE INVENTION

The invention relates to electronic systems, and more particularly to novel thermal management of devices, including memory devices.

BACKGROUND AND RELATED ART

With reference to FIG. 1, an example electronic system 10 includes a processor 11 coupled to a memory 13 via a memory controller 15. For example, the electronic system 10 may be a general purpose computer system such as a desktop or laptop computer. Alternatively, the system 10 may be a special purpose system such as a digital audio player or personal digital assistant.

Increasing clock speeds and transistor densities are causing temperature regulation challenges for high-performance microprocessors. In many cases, microprocessors are equipped with on-die or on-package temperature sensors to reduce the component activity level in response to elevated temperatures. For example, the clock speed may be reduced to limit the active switching power. Reducing the activity level is sometimes referred to as "throttling."

Components in the memory subsystem face thermal management issues as well. Direct or indirect temperature sensing and feedback have been proposed for controlling memory temperature. For example, U.S. Patent Publication No. 2002/0143488 describes a system which determines throttle settings using a thermal sensor. PCT Publication No. WO 00/11675 also describes controlling data transmission rates based on a temperature of a component, which in some examples includes a temperature sensor coupled to a memory module. However, the additional cost and complexity of a temperature sensor are less desirable for high-volume memory applications.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

FIG. 1 is a block diagram of an electronic system.

FIG. 2 is a flow diagram of a method for managing thermal characteristics of a memory device using an access budget.

DESCRIPTION

Figure 3:
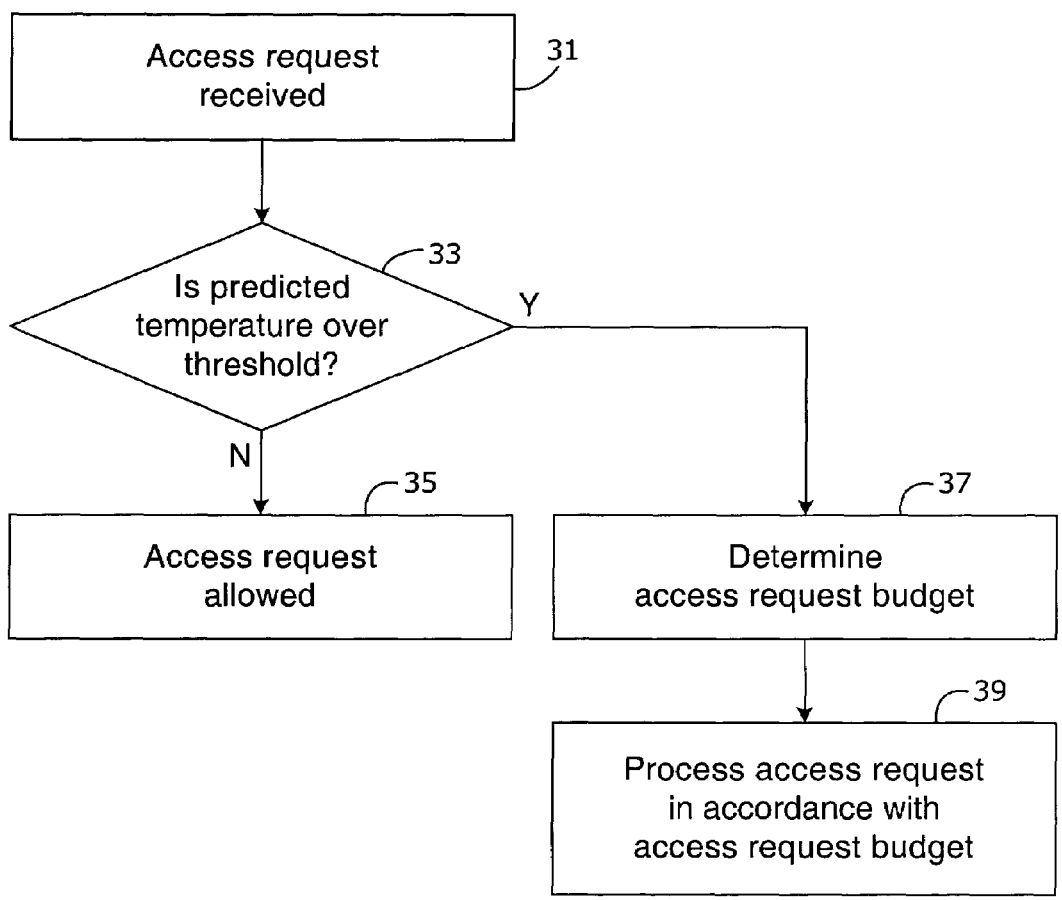
FIG. 3 is a flow diagram of a method for managing thermal characteristics of a device, according to some embodiments of the invention.

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

In general terms, a memory request access control algorithm, in the absence of direct on-package (or on-module) temperature measurement and feedback, utilizes an estimate to account for the cooling rate (e.g. temperature decay) of the memory devices based on environmental and package characteristics, and the heating rate due to memory access requests (e.g. reads and writes). In most systems, a goal is to permit a large number of granted memory access requests (as a metric of memory system performance), to maintain junction temperatures within desired limits, and to have a low computational impact from the thermal budgeting algorithm.

With reference to FIG. 2, an example memory access request control method uses the following features: for every occurrence of an access request (block 21), an access request counter is compared to a calculated budget (block 23); if the access request counter is within the calculated budget, then the access request is granted (block 27) and the access request counter is incremented (block 29); if the access request counter exceeds the calculated budget, then the memory access request is deferred (block 25).

For some embodiments of the present invention, a predicted value of memory device temperature is utilized to control an access request budget, as opposed to an access request counter. For example, an access request budget may be calculated at some large multiple of the access period, and requests are granted until the budget is exhausted. In appropriate circumstances, it is believed that electronic systems utilizing embodiments of the present invention provide higher memory bandwidths than alternate mechanisms while maintaining acceptable junction temperatures of memory devices. For example, it is believed that thermal budgeting according to some embodiments of the invention provides more realistic treatment of actual heating and cooling characteristics of the memory devices as compared to an access request counter.

In general, physical objects reach thermal equilibrium with their surroundings along an exponential curve—i.e., the temperature response to a step-change in external conditions (Eq. 1):

$$T = T_\infty + (T_i - T_\infty) \cdot e^{-\alpha t} \quad \text{(Eq. 1)}$$

Where: T corresponds to temperature as a function of time;
$T_\infty$ corresponds to an equilibrium temperature;
$T_i$ corresponds to an initial temperature; and
$\alpha$ corresponds to a decay rate (e.g. a memory thermal time constant).

The value for $\alpha$ may be determined, for example, through numerical, experimental, or analytical characterization, and depends upon various factors, including, for example, the thermal conductivity of the memory devices, the approach or device airflow velocity, DIMM pitch, etc. Expanding the term from Eq. 1 for equilibrium temperature ($T_\infty = T_a + P \cdot \theta_{ja}$) provides a prediction of memory device temperature in accordance with physical characteristics of device operation (Eq. 2):

$$T = (T_a + P \cdot \theta_{ja}) + [T_i - (T_a + P \cdot \theta_{ja})] \cdot e^{-\alpha t} \quad \text{(Eq. 2)}$$

Where: $T_a$ corresponds to an ambient temperature;
P corresponds to a device power; and
$\theta_{ja}$ corresponds to a junction-to-ambient thermal resistance.

With suitable modeling and testing to determine the various constants, the prediction of the memory device temperature may be relatively realistic as compared to the actual physical behavior of the memory device.

According to some embodiments, various assumptions may be made for purposes of simplification. For example, the temperature prediction may not distinguish between active device power, $P_{active}$ (related to memory read/write activity) and standby power, $P_{standby}$ (present whenever the memory subsystem is operating). A linear fit to Eq. 2 with an update period of $\Delta_{update}$ provides a memory temperature prediction in accordance with the following equation (Eq. 3).

$$T_n = \quad \text{(Eq. 3)}$$
$$T_{n-1} - \left[ T_{n-1} - \left( T_a + P_{max} \cdot \theta_{ja} \cdot \frac{1/f_{request}}{\Delta_{update}} \cdot R_{count} \right) \right] \cdot \Delta_{update} \cdot \alpha$$

Where:
$T_{n-1}$ corresponds to a previous temperature estimate;
$P_{max}$ corresponds to a maximum memory power;
$f_{request}$ corresponds to an access request frequency (e.g. a clock rate);
$\Delta_{update}$ corresponds to an estimator update period; and
$R_{count}$ corresponds to a number of access requests granted.

The term $(1/f_{request}/\Delta_{update} * R_{count})$ corresponds to a percentage of time in each update period that memory access requests were granted. For example, the term corresponds to an activity factor.

Simplification of Eq. 3 yields the following expression (Eq. 4).

$$T_n = T_{n-1} - [T_{n-1} - (T_a + c_1 \cdot R_{count})] \cdot c_2 \quad \text{(Eq. 4)}$$

Where:
$c_1$ is $(P_{max} * \theta_{ja} * 1/f_{request}/\Delta_{update})$; and
$c_2$ is $(\Delta_{update} * \alpha)$.

This equation includes two multiply operations, one add, and two subtracts, and with appropriate choice of units, all operations can be integer operations.

With an updated knowledge of device temperature, the access request counter may be reset and the access request budget may be recalculated. In some embodiments, the access request budget may be determined by setting $T_n = T_{max}$ in Eq. 3, and solving for $R_{budget}$ (Eq. 5), which corresponds to $R_{count}$ per update period (e.g., the number of access requests that will be granted each update period).

$$R_{budget} = \frac{\frac{T_{max} - T_{n-1}}{\Delta_{update} \cdot \alpha} + T_{n-1} - T_a}{P_{max} \cdot \theta_{ja} \cdot 1/f_{request}} \quad \text{(Eq. 5)}$$

However, a detailed equation for $R_{budget}$ is not required. For example, the budget may only be imposed when full memory bandwidth is estimated to potentially cause memory junction temperatures to exceed a pre-determined temperature limit. For example, the temperature limit in this instance may be determined from Eq. 3 by setting $T_n = T_{max}$ and $R_{count} = 1/f_{request}/\Delta_{period}$ and solving for $T_{n-1}$ (Eq. 6). Note equation yields a constant for a given ambient temperature.

$$T_{limit} \geq \frac{T_{max} - (P_{max} \cdot \theta_{ja} + T_a) \cdot \Delta_{update} \cdot \alpha}{1 - \Delta_{update} \cdot \alpha} \quad \text{(Eq. 6)}$$

Then, in some embodiments, $T_{n-1}$ is compared to the temperature limit, $T_{limit}$; if $T_{n-1} > T_{limit}$, then an access request budget may be imposed. For example, the imposed access request budget may be pre-calculated or calculated in accordance with Eq. 7.

$$R_{budget} = \frac{T_{max} - T_a}{P_{max} \cdot \theta_{ja} \cdot 1/f_{request}} \quad \text{(Eq. 7)}$$

For example, $R_{budget}$ may be determined by setting $T_{n-1} = T_{max}$ in Eq. 5 and solving for $R_{budget}$, which is equal to $R_{count}$ per update period (e.g., the number of access requests that will be granted each update period). In some embodiments, a pre-calculated access request budget may be used for all operations. In some embodiments, an access request budget may be updated periodically in accordance with periodic updates of $T_a$. In some embodiments, an access request budget may be newly calculated each time an access request budget is imposed.

Advantageously, this equation also yields a constant for a given ambient temperature, and that simplification can further reduce the number of mathematical operations (Eq. 8):

$$R_{budget} = (T_{max} - T_a) \cdot c_3 \quad \text{(Eq. 8)}$$

Where:
$c_3$ is $1/(P_{max} * \theta_{ja} * 1/f_{request})$

With reference to FIG. 3, an example method according to some embodiments of the invention is as follows. An access request occurs (block 31). A determination is made as to whether a predicted temperature is over a threshold (block 33). For example, the predicted temperature is determined in accordance with the access request using one or more of the foregoing equations. If the predicted temperature is determined to not be over the threshold, the access request is granted (block 35). If the predicted temperature is determined to be over the threshold, an access request budget is determined (block 37). For example, the access request budget is determined using one or more of the foregoing equations. The access request is then processed in accordance with the access request budget (block 39). For example, if the access request exceeds the determined access request budget, the access request may be deferred.

Advantageously, because some embodiments of the invention do not impose an access request budget until a predicted temperature exceeds the threshold, access processing overhead is reduced. Moreover, with appropriately selected constants, some embodiments of the invention more accurately model the actual thermal behavior of the device, providing potentially higher bandwidths while maintaining junction temperatures within suitable limits. In addition, some embodiments of the invention provide relatively accurate modeling of device thermal behavior without the cost or complexity of physical sensors.

With reference to FIGS. 4-9, representative performance graphs are provided for a nominal, simulated system having the following characteristics:

$T_{max}$=95° C. (maximum sustained junction temperature);
$T_a$=45° C. (maximum ambient temperature, not updated);
$P_{max} \times \theta_{ja}$=100° C. (temperature rise at full bandwidth);
$f_{request}$=1 kHz;
$\Delta_{update}$=1.0 sec; and
$\alpha$=0.05.

Figure 4:
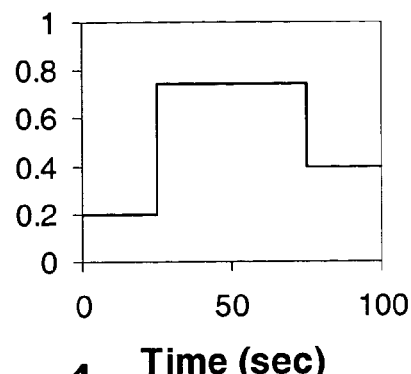
FIG. 4 is a graph of an example memory access request load over time.

In FIG. 4, a nominal memory access probability for a one hundred (100) second time simulation has a 20% probability from time zero to 25, a 75% probability from time 25 to 75, and a 40% probability thereafter. The foregoing characteristics are nominally selected for illustration purposes and do not correspond to a physical device.

Figure 5:
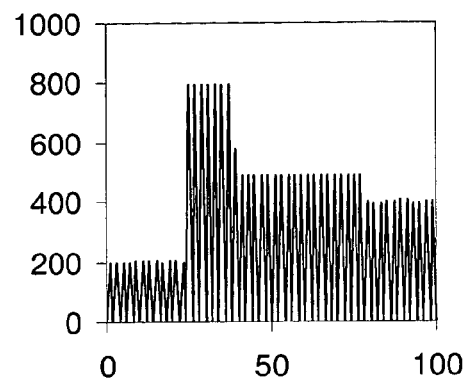
FIG. 5 is a graph of access requests granted, according to some embodiments of the invention.
Figure 6:
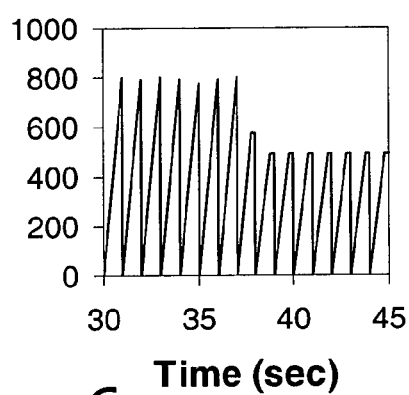
FIG. 6 is an enlarged view of the graph of access requests from FIG. 5.
Figure 7:
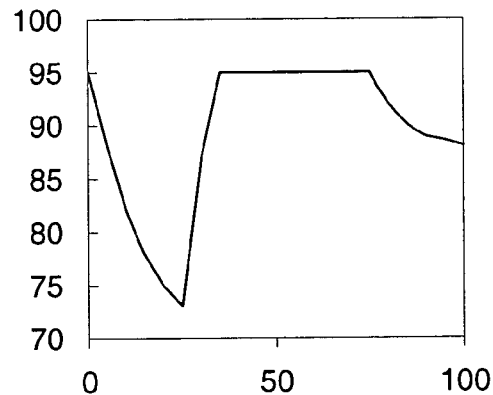
FIG. 7 is a graph of calculated memory temperature, according to some embodiments of the invention.
Figure 8:
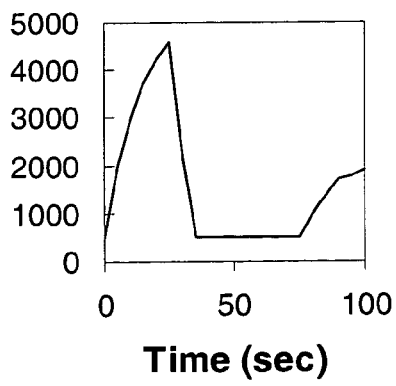
FIG. 8 is a graph of access request budgets versus time, according to some embodiments of the invention.
Figure 9:
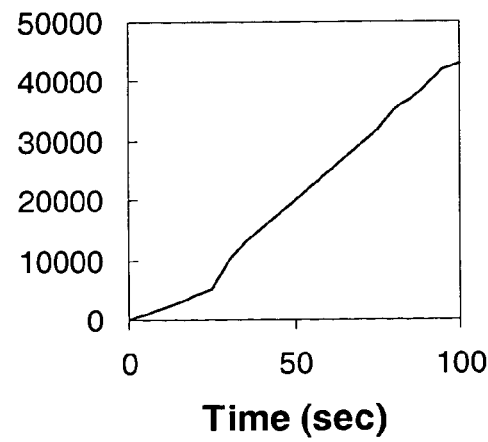
FIG. 9 is a graph of total requests granted, according to some embodiments of the invention.
Figure 10:
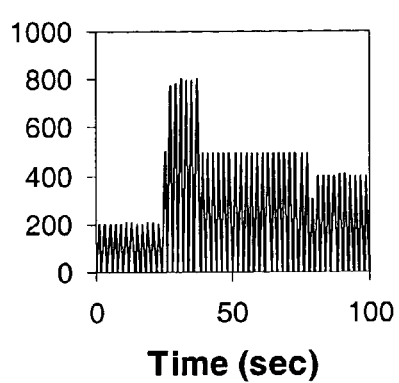
FIG. 10 is another graph of access requests granted, according to some embodiments of the invention.
Figure 11:
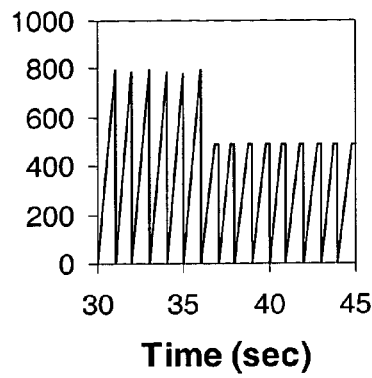
FIG. 11 is an enlarged view of the graph of access requests from FIG. 10.
Figure 12:
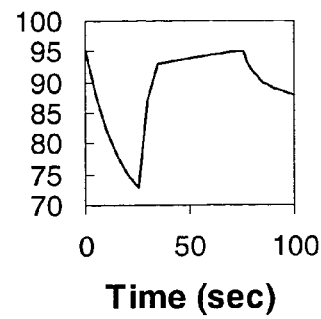
FIG. 12 is another graph of calculated memory temperature, according to some embodiments of the invention.

FIGS. 5-6 show the number of access requests granted during each update period interval, with FIG. 6 showing an expanded time range. FIG. 7 shows a calculated device temperature. With reference to FIG. 7, the device starts at 95° C., cools during a period of low activity, increases during the period of sustained high bandwidth activity until it reaches the nominal maximum of 95° C., and finally resumes cooling when the activity decreases. FIG. 8 shows a calculated access request budget. For example, the access request budget is calculated using the full equation from Eq. 5. In this example, the sustainable bandwidth at $T_{max}$ corresponds to about a 50% activity level. FIG. 9 shows an integrated count of total memory access requests granted over time.

Figure 13:
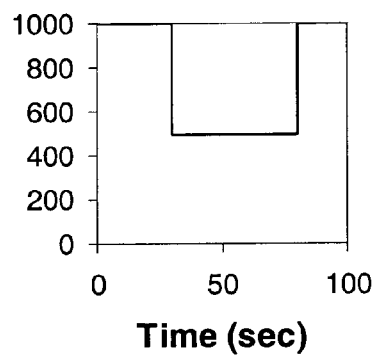
FIG. 13 is another graph of access request budgets versus time, according to some embodiments of the invention.
Figure 14:
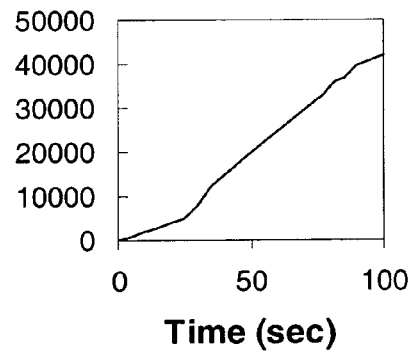
FIG. 14 is another graph of total requests granted, according to some embodiments of the invention.

FIGS. 10-14 shows performance graphs for a simulated system having the same general characteristics as the system of FIGS. 4-9. In the present system, the simplified equation from Eq. 6 is used to determine the calculated access request budget. Also, as can be seen in FIG. 13, no budget is imposed unless the calculated temperature is over a predetermined threshold (in this example, 90° C.). Because the simplified equation is used, more conservative timing for imposing the budget may be preferred to ensure that that $T_{max}$ is not exceeded. In comparison to the system of FIGS. 4-9, the budget is imposed a little earlier, with a small performance penalty of about 100 access requests (e.g. using the full equation about 100 more requests are granted from time 37-38 in FIG. 6).

In comparison with the method illustrated in connection with FIG. 2, simulations demonstrate that the method of FIG. 3 provides higher bandwidth for high access request rates. Performance may be similar for constant low bandwidth access requests, because throttling/budgeting is not a substantial factor for low access request rates. However, for prolonged high bandwidth requests and also for burst type requests, the method of FIG. 3 has better performance.

Figure 15:
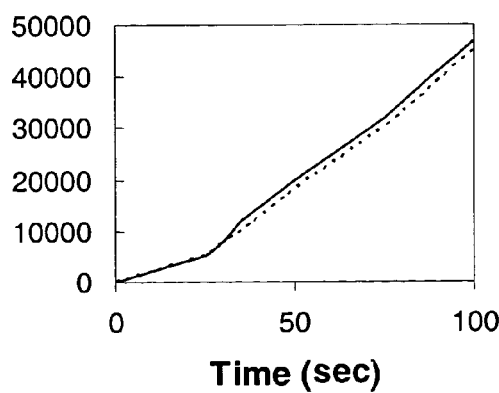
FIG. 15 is a comparison graph of total requests granted, comparing some embodiments of the invention to another throttling technique.
Figure 16:
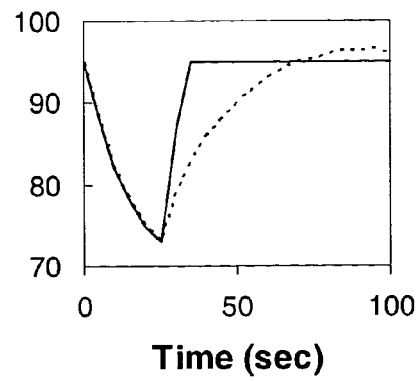
FIG. 16 is a comparison graph of calculated memory temperature, according to some embodiments of the invention.

With reference to FIGS. 15, for the access request profile from FIG. 4, the comparison graph shows that the method of FIG. 3 (solid line) provides more total requests granted as compared to the method of FIG. 2 (dashed line). With reference to FIG. 16, the calculated temperature shows that the method of FIG. 2 (dashed line) may permit the device temperature to overshoot the desired maximum temperature.

Figure 17:
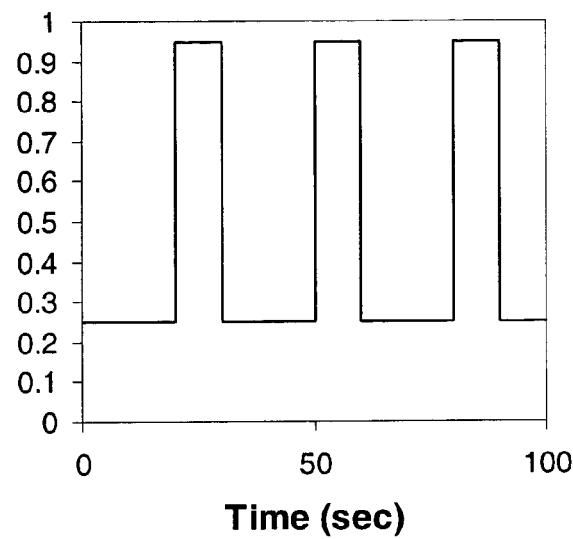
FIG. 17 is another graph of an example memory access request load over time.
Figure 18:
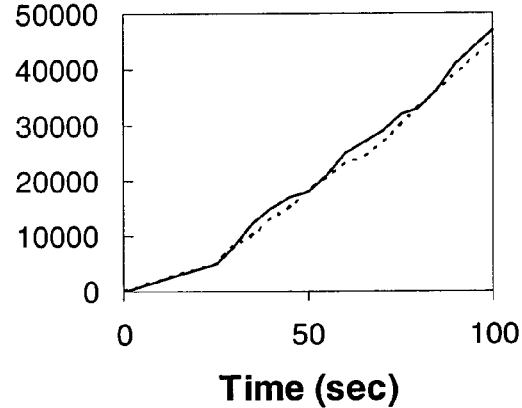
FIG. 18 is a comparison graph of total requests granted, comparing some embodiments of the invention to another throttling technique.
Figure 19:
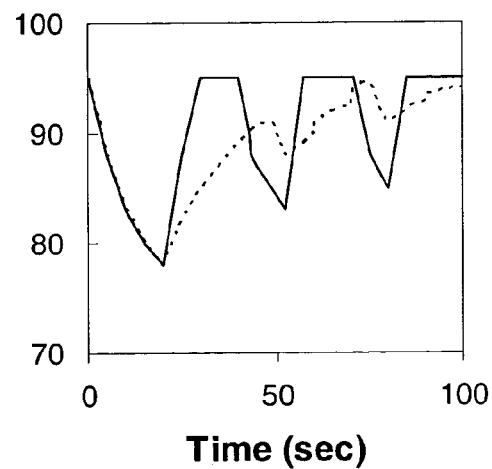
FIG. 19 is a comparison graph of calculated memory temperature, according to some embodiments of the invention.

With reference to FIG. 17, another simulated access rate includes three burst-type accesses where the access request probability goes from 25% to 95% for a short duration. With reference to FIG. 18, the total number of requests granted over time shows how the method of FIG. 3 (solid line) grants more requests more quickly than the method of FIG. 2 (dashed line). FIG. 19 shows the calculated temperatures for both methods.

The foregoing and other aspects of the invention are achieved individually and in combination. The invention should not be construed as requiring two or more of the such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. An apparatus comprising:
a device having a thermal characteristic which is dependent on a number of times the device is accessed over a period of time; and
a controller connected to the device and adapted to control access to the device,
wherein the controller is adapted to calculate a temperature estimate of the device and to control access to the device in accordance with the calculated temperature estimate,
wherein the controller is adapted to receive an access request, calculate the temperature estimate in accordance with the access request, determine if the temperature estimate exceeds a temperature threshold, and impose an access request budget if the temperature estimate exceeds the temperature threshold,
wherein the controller is adapted to calculate a new access request budget each time the access request budget is imposed.

2. An apparatus comprising:
a device having a thermal characteristic which is dependent on a number of times the device is accessed over a period of time; and
a controller connected to the device and adapted to control access to the device,
wherein the controller is adapted to calculate a temperature estimate of the device and to control access to the device in accordance with the calculated temperature estimate, wherein the controller is adapted to receive an access request, calculate the temperature estimate in accordance with the access request, determine if the temperature estimate exceeds a temperature threshold, and impose an access request budget if the temperature estimate exceeds the temperature threshold, wherein the controller is adapted to calculate a new access request budget periodically.

3. The apparatus of claim 2, wherein the controller is adapted to calculate the new access request budget when a parameter involved in the calculation is updated.

4. The apparatus of claim 3, wherein the updated parameter corresponds to an ambient temperature.

5. An apparatus comprising:
a device having a thermal characteristic which is dependent on a number of times the device is accessed over a period of time; and
a controller connected to the device and adapted to control access to the device,
wherein the controller is adapted to calculate a temperature estimate of the device and to control access to the device in accordance with the calculated temperature estimate,
wherein the controller is adapted to calculate the temperature estimate in accordance with an estimated initial temperature of the device, an estimated equilibrium temperature of the device, and an estimated temperature decay rate for the device.

6. The apparatus of claim 5, wherein the controller is adapted to calculate the temperature estimate in accordance with the following equation:

$$T_n = T_{n-1} - \left[ T_{n-1} - \left( T_a + P_{\max} \cdot \theta_{ja} \cdot \frac{1/f_{request}}{\Delta_{update}} \cdot R_{count} \right) \right] \cdot \Delta_{update} \cdot \alpha;$$

where: $T_n$ corresponds to the temperature estimate;
$T_{n-1}$ corresponds to a previous temperature estimate;
$T_a$ corresponds to an ambient temperature;
$P_{max}$ corresponds to a maximum device power;
$\theta_{ja}$ corresponds to a junction-to-ambient thermal resistance
$f_{request}$ corresponds to an access request frequency (e.g. a clock rate);
$\Delta_{update}$ corresponds to an estimator update period;
$R_{count}$ corresponds to a number of access requests granted; and
$\alpha$ corresponds to a decay rate.

7. The apparatus of claim 5, wherein the controller is adapted to calculate the temperature estimate in accordance with the following equation:

$T_n = T_{n-1} - [T_{n-1} - (T_a + c_1 \cdot R_{count})] \cdot c_2$ where: $T_n$ corresponds to the temperature estimate;
$T_{n-1}$ corresponds to a previous temperature estimate;
$T_a$ corresponds to an ambient temperature;
$R_{count}$ corresponds to a number of access requests granted;
$c_1$ is a first constant; and
$c_2$ is a second constant.

8. The apparatus of claim 7, wherein $c_1$ corresponds to $(P_{max} * \theta_{ja} * 1/f_{request}/\Delta_{update})$ and $c_2$ corresponds to $(\Delta_{update} * \alpha)$;
where: $P_{max}$ corresponds to a maximum device power;
$\theta_{ja}$ corresponds to a junction-to-ambient thermal resistance
$f_{request}$ corresponds to an access request frequency (e.g. a clock rate);
$\Delta_{update}$ corresponds to an estimator update period;
$\alpha$ corresponds to a decay rate.

9. A method comprising:
providing a device having a thermal characteristic which is dependent on a number of times the device is accessed over a period of time;
calculating a temperature estimate of the device;
controlling access to the device in accordance with the calculated temperature estimate,
receiving an access request;
calculating the temperature estimate in accordance with the access request;
determining if the temperature estimate exceeds a temperature threshold;
imposing an access request budget if the temperature estimate exceeds the temperature threshold; and
calculating a new access request budget each time the access request budget is imposed.

10. A method comprising:
providing a device having a thermal characteristic which is dependent on a number of times the device is accessed over a period of time;
calculating a temperature estimate of the device;
controlling access to the device in accordance with the calculated temperature estimate,
receiving an access request;
calculating the temperature estimate in accordance with the access request;
determining if the temperature estimate exceeds a temperature threshold;
imposing an access request budget if the temperature estimate exceeds the temperature threshold; and
calculating a new access request budget periodically.

11. The method of claim 10, the new access request budget is calculated when a parameter involved in the calculation is updated.

12. The method of claim 11, wherein the updated parameter corresponds to an ambient temperature.

13. A method comprising:
providing a device having a thermal characteristic which is dependent on a number of times the device is accessed over a period of time;
calculating a temperature estimate of the device; and
controlling access to the device in accordance with the calculated temperature estimate,
wherein the calculating comprises calculating the temperature estimate in accordance with an estimated initial temperature of the device, an estimated equilibrium temperature of the device, and an estimated temperature decay rate for the device.

14. The method of claim 13, wherein the temperature estimate is calculated in accordance with the following equation:

$$T_n = T_{n-1} - \left[ T_{n-1} - \left( T_a + P_{\max} \cdot \theta_{ja} \cdot \frac{1/f_{request}}{\Delta_{update}} \cdot R_{count} \right) \right] \cdot \Delta_{update} \cdot \alpha;$$

where: $T_n$ corresponds to the temperature estimate;
$T_{n-1}$ corresponds to a previous temperature estimate;
$T_a$ corresponds to an ambient temperature;
$P_{max}$ corresponds to a maximum device power;
$\theta_{ja}$ corresponds to a junction-to-ambient thermal resistance $f_{request}$ corresponds to an access request frequency (e.g. a clock rate);

$\Delta_{update}$ corresponds to an estimator update period;

$R_{count}$ corresponds to a number of access requests granted; and $\alpha$ corresponds to a decay rate.

15. The method of claim 13, wherein the temperature estimate is calculated in accordance with the following equation:

$$T_n = T_{n-1} - [T_{n-1} - (T_a + c_1 \cdot R_{count})] \cdot c_2$$

where: $T_n$ corresponds to the temperature estimate;

$T_{n-1}$ corresponds to a previous temperature estimate;

$T_a$ corresponds to an ambient temperature;

$R_{count}$ corresponds to a number of access requests granted;

$c_1$ is a first constant; and $c_2$ is a second constant.

16. The method of claim 15, wherein $c_1$ corresponds to $(P_{max} * \theta_{ja} * 1/f_{request}/\Delta_{update})$ and $c_2$ corresponds to $(\Delta_{update} * \alpha)$;

where: $P_{max}$ corresponds to a maximum device power;

$\theta_{ja}$ corresponds to a junction-to-ambient thermal resistance $f_{request}$ corresponds to an access request frequency (e.g. a clock rate);

$\Delta_{update}$ corresponds to an estimator update period;

$\alpha$ corresponds to a decay rate.

17. A system comprising:

a processor;

a device; and a controller connected between the processor and the device, wherein the controller is adapted to calculate a temperature estimate of the device and to control access to the device in accordance with the calculated temperature estimate, wherein the controller is adapted to receive an access request, calculate the temperature estimate in accordance with the access request, determine if the temperature estimate exceeds a temperature threshold, and impose an access request budget if the temperature estimate exceeds the temperature threshold, wherein the controller is adapted to calculate a new access request budget each time the access request budget is imposed.

18. A system comprising:

a processor;

a device; and a controller connected between the processor and the device, wherein the controller is adapted to calculate a temperature estimate of the device and to control access to the device in accordance with the calculated temperature estimate, wherein the controller is adapted to receive an access request, calculate the temperature estimate in accordance with the access request, determine if the temperature estimate exceeds a temperature threshold, and impose an access request budget if the temperature estimate exceeds the temperature threshold, wherein the controller is adapted to calculate a new access request budget periodically.

19. The system of claim 18, wherein the controller is adapted to calculate the new access request budget when a parameter involved in the calculation is updated.

20. The system of claim 19, wherein the updated parameter corresponds to an ambient temperature.

21. A system comprising:

a processor;

a device; and a controller connected between the processor and the device, wherein the controller is adapted to calculate a temperature estimate of the device and to control access to the device in accordance with the calculated temperature estimate, wherein the controller is adapted to calculate the temperature estimate in accordance with an estimated initial temperature of the device, an estimated equilibrium temperature of the device, and an estimated temperature decay rate for the device.

22. The system of claim 21, wherein the controller is adapted to calculate the temperature estimate in accordance with the following equation:

$$T_n = T_{n-1} - \left[T_{n-1} - \left(T_a + P_{max} \cdot \theta_{ja} \cdot \frac{1/f_{request}}{\Delta_{update}} \cdot R_{count}\right)\right] \cdot \Delta_{update} \cdot \alpha;$$

where: $T_n$ corresponds to the temperature estimate;

$T_{n-1}$ corresponds to a previous temperature estimate;

$T_a$ corresponds to an ambient temperature;

$P_{max}$ corresponds to a maximum device power;

$\theta_{ja}$ corresponds to a junction-to-ambient thermal resistance $f_{request}$ corresponds to an access request frequency (e.g. a clock rate);

$\Delta_{update}$ corresponds to an estimator update period;

$R_{count}$ corresponds to a number of access requests granted; and $\alpha$ corresponds to a decay rate.

23. The system of claim 21, wherein the controller is adapted to calculate the temperature estimate in accordance with the following equation:

$$T_n = [T_{n-1} - T_{n-1} - (T_a + c_1 \cdot R_{count})] \cdot c_2$$

where: $T_n$ corresponds to the temperature estimate;

$T_{n-1}$ corresponds to a previous temperature estimate;

$T_a$ corresponds to an ambient temperature;

$R_{count}$ corresponds to a number of access requests granted;

$c_1$ is a first constant, and $c_2$ is a second constant.

24. The system of claim 23, wherein $c_1$ corresponds to $(P_{max} * \theta_{ja} * 1/f_{request}/\Delta_{update})$ and $c_2$ corresponds to $(\Delta_{update} * \alpha)$;

where: $P_{max}$ corresponds to a maximum device power;

$\theta_{ja}$ corresponds to a junction-to-ambient thermal resistance $f_{request}$ corresponds to an access request frequency (e.g. a clock rate);

$\Delta_{update}$ corresponds to an estimator update period;

$\alpha$ corresponds to a decay rate.

* * * * *